United States Patent
Nelson et al.

(10) Patent No.: US 7,340,024 B1
(45) Date of Patent: Mar. 4, 2008

(54) PARALLEL FRACTIONAL INTERPOLATOR WITH DATA-RATE CLOCK SYNCHRONIZATION

(75) Inventors: David Scott Nelson, Salt Lake City, UT (US); L. Andrew Gibson, Jr., Riverton, UT (US); Osama Sami Haddadin, Salt Lake City, UT (US); Michael Dennis Pulsipher, Layton, UT (US)

(73) Assignee: L3 Communications Corporation, New York, NY (US)

( * ) Notice: Subject to any disclaimer, the term of this patent is extended or adjusted under 35 U.S.C. 154(b) by 663 days.

(21) Appl. No.: 10/690,898

(22) Filed: Oct. 22, 2003

(51) Int. Cl.
*H04L 7/00* (2006.01)

(52) U.S. Cl. .................. 375/355; 375/293; 375/294

(58) Field of Classification Search .............. 375/355, 375/293, 294
See application file for complete search history.

(56) References Cited

U.S. PATENT DOCUMENTS

| | | | |
|---|---|---|---|
| 5,805,619 A * | 9/1998 | Gardner et al. ............ | 714/814 |
| 5,812,608 A | 9/1998 | Valimaki et al. ........... | 375/331 |
| 5,832,043 A * | 11/1998 | Eory ......................... | 375/344 |
| 6,353,369 B1 * | 3/2002 | Boerstler .................... | 331/57 |
| 2003/0069009 A1 * | 4/2003 | Harnden et al. ........... | 455/423 |
| 2003/0204542 A1 * | 10/2003 | Mueller ...................... | 708/290 |
| 2004/0148319 A1 * | 7/2004 | Bossmeyer et al. ........ | 708/200 |

OTHER PUBLICATIONS

Fredric J. Harris, "Multirate Digital Filters for Symbol Timing Synchonization in Software Defined Radios", IEEE Journal on Selected Areas in Communications, vol. 19, No. 12, Dec. 2001, pp. 2346-2357.

Floyd M. Gardner, "Interpolation in Digital Modems-Part I: Fundamentals", IEEE Transactions on Communications, vol. 41, No. 3, Mar. 1993, pp. 501-507.

Lars Erup, "Interpolation in Digital Modems-Part II: Implementation and Performance", IEEE Transactions on Communications, vol. 41, No. 6, Jun. 1993, pp. 998-1008.

Gabriel Watkins, "Optimal Farrow Coefficients for Symbol Timing Recovery", IEEE Communications Letters, vol. 5, No. 9, Sep. 2001, pp. 381-383.

Jussi Vesma et al., "The Effects of Quantizing the Fractional Interval in Interpolation Filters", Tampere University of Technology, Finland.

V. Valimaki and T. I. Laakso, "Principles of Fractional Delay Filters", IEEE International Conference on Acoustics, Speech, and Signal Processing, Istanbul, Turkey, Jun. 2000, pp. 1-4.

* cited by examiner

*Primary Examiner*—David C. Payne
*Assistant Examiner*—Nader Bolourchi
(74) *Attorney, Agent, or Firm*—Harrington & Smith, PC (57) ABSTRACT

A circuit for single or parallel digital fractional interpolation of data samples has a fractional interpolator filter, an oscillator for outputting timing signals to the fractional interpolator filter, and a detector loop with a strobe feedback from the oscillator for outputting a frequency adjustment to the oscillator. Three different approaches are shown to determine the frequency adjustment. One approach is to generate a pulse based on the symbol clock, and measure the differences between the pulse and the strobe and between the strobe and the pulse. The smaller is the frequency adjustment. Another approach is to adjust the strobe period to match the symbol clock period. A third approach is to add an oscillator-driven clock to the symbol clock and integrate the sum over a symbol clock period to generate the frequency adjustment. Preferably, the interpolator filter takes N parallel inputs and samples each in parallel based on a plurality of oscillator timing signals, each corrected with reference to the frequency adjustment.

10 Claims, 10 Drawing Sheets

FIG.2

FRACTIONAL INTERPOLATOR FOR N=3

PARALLEL FRACTIONAL INTERPOLATOR WITH DATA-RATE CLOCK SYNCHRONIZATION

TECHNICAL FIELD

These teachings relate generally to fractional interpolation of a sampled digital signal. More particularly, they are related to timing synchronization to determine a sampling time for a fractional interpolator, especially synchronizing timing for a plurality of filters coupled together in electrical parallel so as to enable faster data rates.

BACKGROUND

There are a variety of competing modulation techniques for wideband communications, including, for example, Phase Shift Keying (PSK), Amplitude Shift Keying (ASK), Quadrature Amplitude Modulation (QAM), and variations of each, to name a few. There is an increasing need for communication transmitters and receivers that can process and code/decode more than one modulated waveform. For example, various U.S. Government agencies communicate using Common Data Link Class 1 category A and B waveforms, Terrestrial Line of Sight waveform, classified direct downlink waveform, numerous waveforms for civil and military communications with satellites and/or military assets, and the (to be determined) commercial teledesic waveform. Overlap between these agencies, and between arms of other governments or multinational corporations that communicate over numerous disparate systems, is driving a need for flexible-modulation hardware that can operate among various communications waveforms such as those above. One approach in achieving the above hardware flexibility is a modem that is programmable for a variety of modulation schemes. Such a modem is termed a programmable digital modem, which falls within the class of software-defined radios.

Figure 1A:
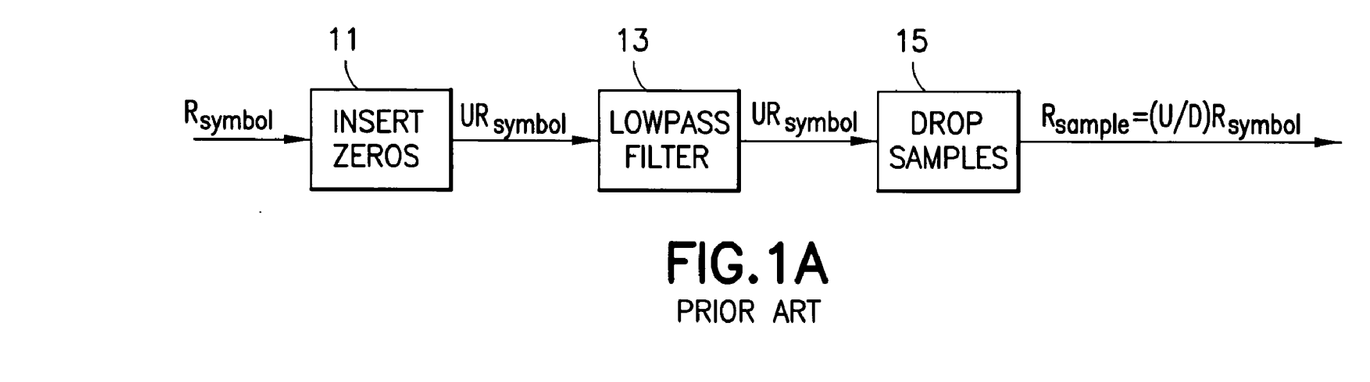
FIG. 1A is a block diagram of a prior art sampling system using an interpolator and a decimator.

Traditional pulse shaping is followed by interpolation by some integer factor, and is shown in block diagram form at FIG. 1A. Data input into an upsampling filter 11 at a symbol rate $R_{symbol}$ is upsampled by a factor of U, wherein U is an integer. The output from the upsampling filter 11 is then $UR_{symbol}$, which is passed through a low pass filter 13 and input into a decimator 15. The decimator 15 selects only some of the samples input thereto and discards the remainder, outputting data at a rate of $$R_{sample} = \frac{U}{D} R_{symbol}.$$

The decimation factor D is an integer because the decimator 15 selects a fixed number of samples from each of the data samples within a symbol period. This traditional approach restricts the sample rate to always be related to the symbol by an integer factor U, such that $R_{sample} = UR_{symbol}$. This restriction may be acceptable in modems with a limited set of symbol-rate requirements, particularly if the set of symbol rates are related by an integer factor. In highly flexible modem designs with a large set of non-integer related symbol rates, this traditional approach would impose difficulties in the design of corresponding digital-to-analog conversion and the analog reconstruction filter that follows (i.e., mixed-signal and analog design). Specifically, the digital-to-analog converter clocked at the clock rate would have to satisfy all possible cases of sample rates. The analog reconstruction filter generally has a cut-off frequency equal to one half the sample rate, which would impose additional error when the sample rate changes dramatically with respect to the symbol rate.

Traditional fractional interpolation using upsampling and decimation imposes additional hardware requirements, is computationally expensive, and the necessary division operation imposes a timing jitter that tends to accumulate absent an additional control loop. For example, to increase a sampling rate from 10 million samples per second (msps) to 15 msps, prior art approaches teach interpolating by the integer factor U=3 to produce an intermediate sampling rate of 30 msps, followed by decimating by the integer factor D=2 to yield the desired 15 msps $$\left(10 msps \times \frac{3}{2} = 15 msps\right).$$

Assuming a desired sample rate of 16 msps from a sample rate of 10 msps, upsampling by a factor U=8 is required to achieve an intermediate sample rate of 80 msps, followed by decimation by the integer factor D=5 to yield the desired sample rate of 16 msps $$\left(10 msps \times \frac{8}{5} = 16 msps\right).$$

Upsampling and decimation thus requires hardware that must process a very high intermediate sample rates. The intermediate sample rate is often the limiting criterion in data transfer speeds, but is itself merely a means to the final sample rate ends. Also, interpolation by a very large factor is required to achieve reasonable accuracy, and filtering must be done on the very high intermediate sampling rate. Therefore, interpolation by upsampling and decimation is generally not practical with field programmable gate arrays (FPGA), digital signal processors, or general-purpose processors, which each form the basis of programmable modems and software-defined radios.

Fractional interpolation is an alternative to the above approach, and refers to a delay from the symbol edge that is not necessarily an integer multiple of the sample interval (presuming uniform sampling, though that is not a limitation to the invention herein). Fractional interpolation enables the ratio of the timing instant to the symbol time to be irrational, which it will be in practically all cases wherein the symbol timing derives from a source (i.e., the system clock) independent of the sample clock. Even assuming the very high intermediate symbol rates as described above, prior art interpolation/decimation approaches only approximate an exact timing instant that true fractional interpolation can yield. That is to say, if an ideal sample time within a symbol period is an integer U plus a fraction $\chi$ of the integer, the prior art approach described above yields an approximation of that time as $$\frac{U}{D}$$

such that $$\frac{U}{D} \cong \chi U,$$

but the prior art approach will exactly yield the ideal sample time only by happenstance.

As can be appreciated, fractional interpolators can be more complex to implement than integer sampling. Prior to this invention, fractional interpolation was limited in speed (sampling rate) and furthermore was limited in an ability to operate at the system's symbol rate. The present invention as described below improves over the above prior art approach.

SUMMARY OF THE PREFERRED EMBODIMENTS

The foregoing and other problems are overcome, and other advantages are realized, in accordance with the presently preferred embodiments of these teachings. The present invention is embodied in a circuit for re-sampling N data inputs, wherein N is an integer greater than or equal to one. The circuit includes an error detector sub-circuit, an oscillator, and at least one fractional interpolator. The error detector sub-circuit has an input coupled to a symbol rate clock and an input coupled to a strobe. The strobe is feedback from the oscillator to synchronize the local clock, such as the sample clock, to the symbol clock.

Preferably, the error detector sub-circuit determines the difference between the strobe and the edge of the symbol rate clock and outputs a frequency adjustment to the oscillator based on that difference. The oscillator has an input coupled to an output of the error-detector sub-circuit as above, and also outputs for outputting N timing signals in parallel and for outputting the strobe. Where N is one, there is just one timing signal. The fractional interpolator filter has an input coupled to the data input and an input coupled to the timing signal from the oscillator. Where N is greater than one, these inputs are N inputs in parallel. The fractional interpolator outputs a re-sampled data output a data signal if N=1, or N data signals in parallel if N is greater than one, that is re-sampled at a time that is not dependent upon being an integer multiple of the symbol period defined by the symbol clock.

The error detection loop may operate in one of at least three ways. Preferably, the error detector loop calculates the frequency adjustment by measuring a difference between a pulse of the symbol timing clock signal and the strobe, comparing that to a difference between the strobe and the symbol timing clock signal, and determining the frequency adjustment based on the smaller of the two differences. Alternatively, the error detector loop determines the frequency adjustment by driving the period of the strobe to match the period of the symbol timing clock. The third disclosed approach is for the error detection loop to sum a signal from an oscillator clock driven by the strobe with the signal from the symbol timing clock, and integrate the sum to determine the frequency adjustment.

A method of fractionally interpolating is also presented that does not require re-sampling at an integer multiple of the symbol period, and does not require excess interpolation followed by decimation. Details are presented below.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1B:
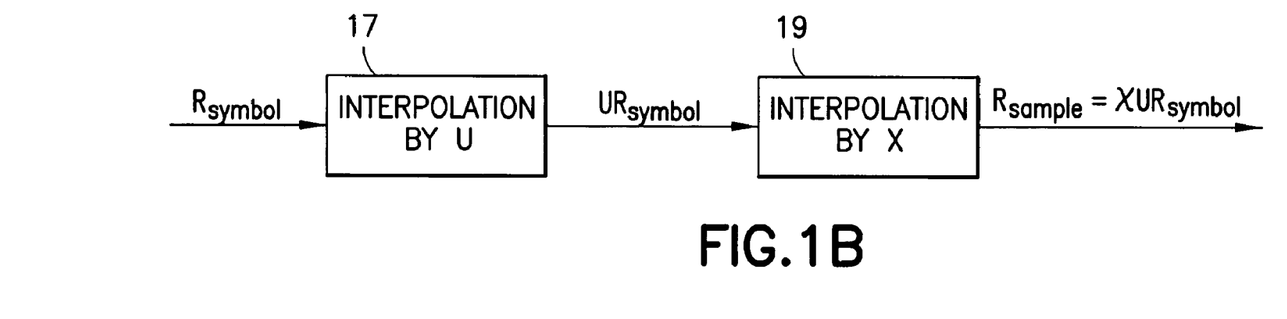
FIG. 1B is a block diagram showing the general approach of the present invention for fractional interpolation in contrast to FIG. 1A.

The present invention improves upon the prior art interpolation/decimation approach described above in that it uses a single fixed sample rate by introducing non-integer interpolation. In the convention introduced in the Background section above, the present invention enables $R_{sample} = \chi U R_{symbol}$, wherein U remains an integer but $\chi$ is any real number. FIG. 1B is a high level block diagram illustrating the general approach of the present invention in contradistinction to the approach of the prior art as described with reference to FIG. 1A. In FIG. 1B, the first stage interpolator 17 interpolates by a factor of U and operates similar to the interpolator 11 of FIG. 1A. However, the value of U differs between FIGS. 1A and 1B because the high intermediate sample rates described with reference to the prior art are not required in FIG. 1B. The second stage interpolator 19 interpolates by a real number $\chi$, so the resultant data rate out of the second stage interpolator is $R_{sample} = \chi U R_{symbol}$, wherein $\chi U$ is a non-integer (except in by happenstance). FIG. 1B avoids decimation and the high intermediate sampling rates associated therewith. To do so, the present invention synchronizes the sample rate clock to the symbol rate clock by one of several methods disclosed below.

Figure 2:
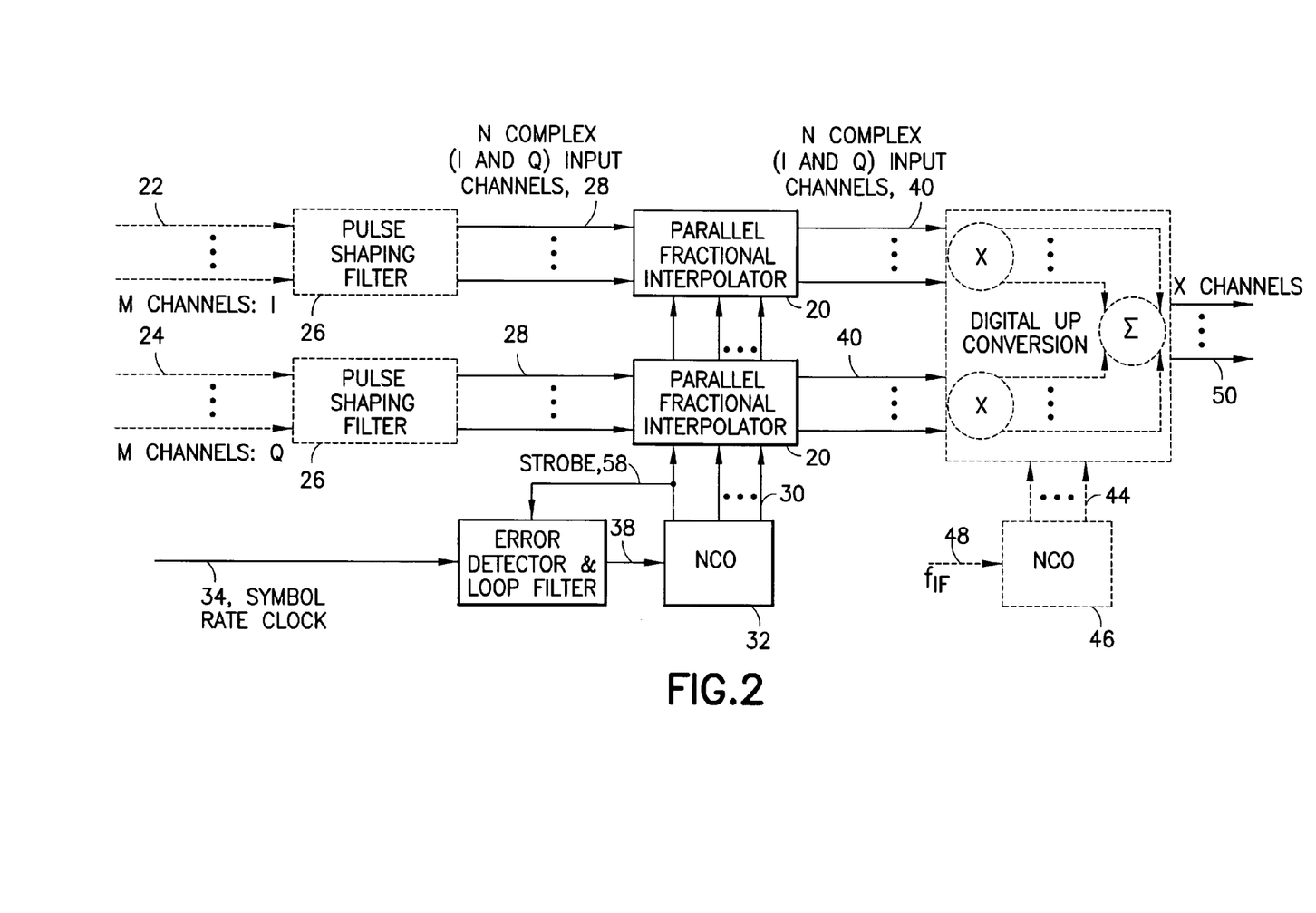
FIG. 2 is a block diagram depicting a pair of parallel fractional interpolators in context with other modulating circuitry.

FIG. 2 is a block diagram showing a pair of fractional interpolators 20 in electrical parallel with one another. A plurality of M data sample blocks are shown, representing consecutive data sample blocks of a single input data stream that have been grouped and block processed to facilitate reduced clock speed. Each M data sample block may be a bit, a symbol, or a plurality of consecutive bits or symbols.

The M data sample blocks are split into in-phase I and quadrature Q components, resulting in an input of M in-phase data sample blocks 22 and M quadrature data sample blocks 24 input in parallel into a pulse shaping filter 26 such as a polyphase filter. Two pulse shaping filters 26 are shown to distinguish the I and Q data samples. The output of each pulse shaping filter 26 is a plurality of N complex (I&Q) data sample blocks 28 that are the inputs to the parallel fractional interpolator, depicted as two interpolators 20 and described below.

Also input into the fractional interpolators 20 is a plurality of N timing signals 30 from a numerically controlled oscillator (NCO) 32. The NCO 32 references a symbol rate clock or symbol timing signal 34 that undergoes error detection and filtering at an error detection circuit 36. The error detection circuit 36 outputs a frequency adjustment 38 to the NCO 32. A strobe 58, generated by the NCO 32, is input back into the error detection circuit 36 for continuous feedback. The output of each fractional interpolator 20 is a series of N fractionally sampled complex signals 40 that pass into a modulation block 42. Within the modulation block 42, each fractionally sampled signal 40 is modulated onto a carrier wave signal 44 provided by an upconverting NCO 46. The carrier wave signal 44 preferably upconverts the fractionally sampled signal 40 to an intermediate frequency $f_{IF}$ 48.

Corresponding I and Q samples are summed, creating a block of real-valued samples that are the outputs 50 from the modulation block 42 that are sent to a digital-to-analog (DAC) converter (not shown). The DAC de-multiplexes the outputs 50 into a serial stream and converts to analog for transmission. that requires fractional interpolation at very high rates. The above is an example of one context in which the fractional interpolator 20 and NCO 32 of the present invention may be employed, though the fractional interpolator 20 and NCO 32 need not be associated with a pulse shaping filter, digital up-conversion, or modulation. Detailed description of the pulse shaping filter 26, the modulation block 42, and the upconverting NCO 46 may be found at co-pending U.S. patent application Ser. Nos. 10/646,259 and 10/637,946, filed on Aug. 21, 2003 and Aug. 8, 2003, respectively, and assigned to the same assignee as this invention. Each of the U.S. patent applications referenced immediately above are herein incorporated by reference.

Figure 3:
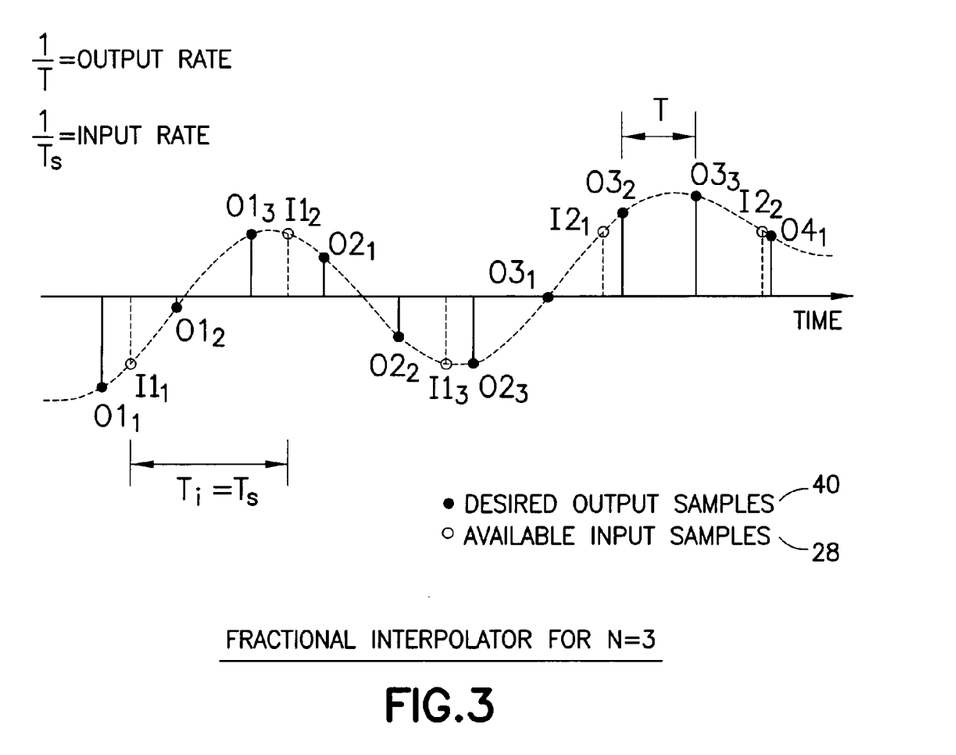
FIG. 3 is a timing diagram showing available input sample times and desired output sample times for a 3-input, 3-output fractional interpolator according to the present invention.

FIG. 3 is a timing diagram for a three-input, three output fractional interpolator 20 according to the present invention. The dashed line represents the underlying complex baseband signal from which the input samples were taken, and along which interpolated samples should lie. The horizontal axis represents time. Actual samples of the signal are depicted as open circles, each of which represent one of the data sample blocks 28 input into the fractional interpolator 20 and separated by a sample rate $1/T_s$ that is constant. Data samples or sample blocks are input and output along N=3 parallel input lines or channels; and output interpolated samples 40 are depicted as solid circles. Along the N=1 channel, the input samples 28 are marked $I1_1$ and $I2_1$, and the output interpolated samples 40 are marked $O1_1$, $O2_1$, $O3_1$, and $O4_1$. Along the N=2 channel, the input samples 28 are marked $I1_2$ and $I2_2$, and the output interpolated samples 40 are marked $O1_2$, $O2_2$, $O3_2$, and $O4_2$. Along the N=3 channel, the input sample 28 is marked $I1_3$, and the output interpolated samples 40 are marked $O1_3$, $O2_3$ and $O3_3$. While the input sample rate $1/T_s$ and the interpolation (output) rate $1/T$ may both be constant, the two are not necessarily related by an integer factor as in the prior art upsample/decimation approach. This is because the inputs 28 are timed to one timing source (e.g., a sample rate clock) and the outputs 40 are timed to a separate, independent timing source (e.g., the system clock or the symbol rate clock 34 deriving from the system clock).

Figure 4:
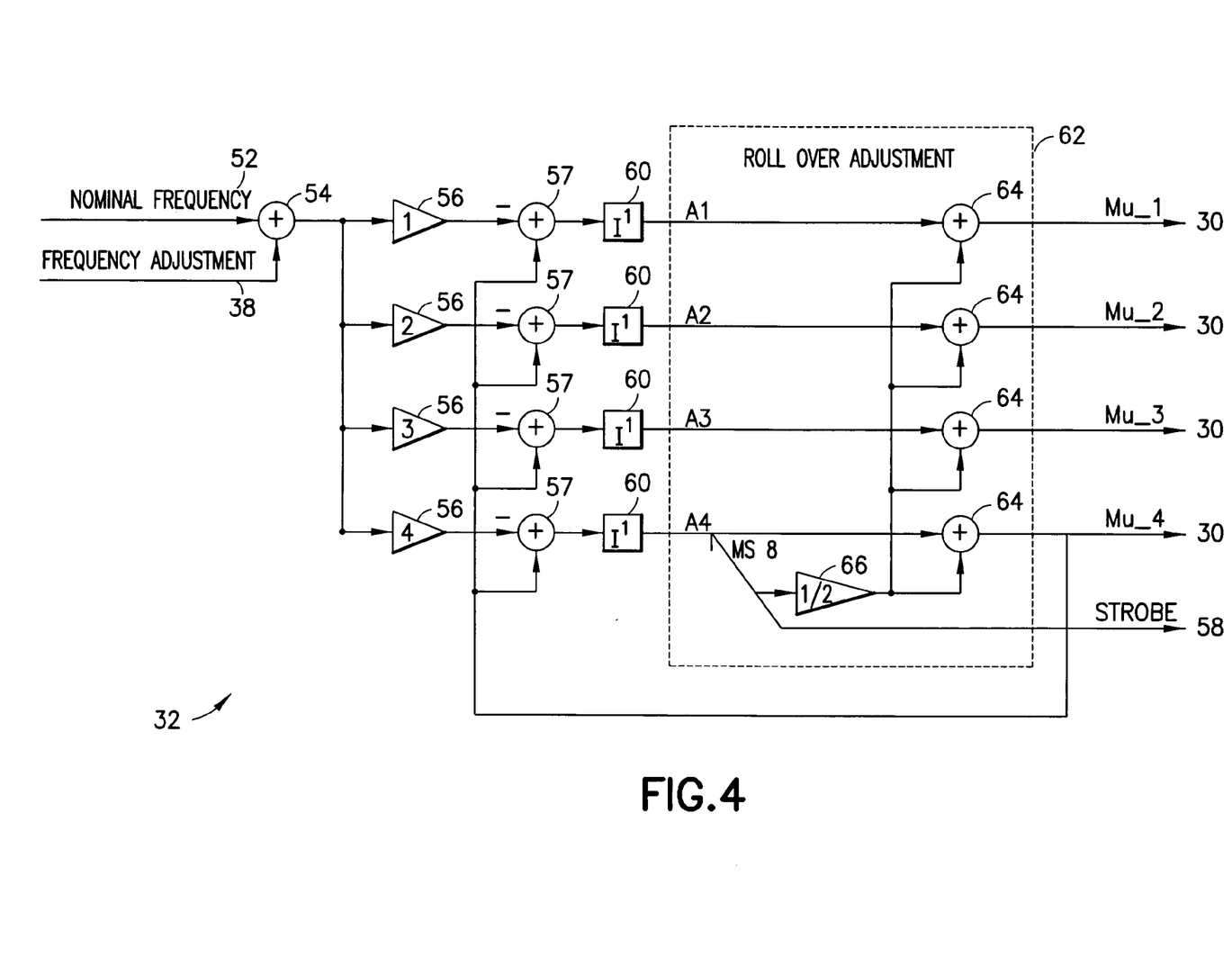
FIG. 4 is a block diagram of the NCO 32 shown in FIG. 1.

FIG. 4 is a block diagram of the NCO 32 shown in FIG. 1. The NCO 32 has two inputs: a frequency adjustment 38 and a nominal frequency 52. The frequency adjustment 38 is the output of the error detection circuit 36 shown in FIG. 1, and represents the amount of frequency change the error detection circuit 36 is requesting in order to maintain phase lock. The nominal frequency 52 is preferably a microprocessor register input that represents the nominal frequency at which the NCO 32 should operate. The nominal frequency 52 and the frequency adjustment 38 are added at an adder 54, and the output of the adder 54 is input into a plurality of amplifiers 56 arranged in parallel, one for each of the N timing signals to be output from the NCO 32. Each successive amplifier has an incrementally larger gain than its predecessor, as shown in the diagram (gain=1, 2, 3 or 4, for N=4). The output of each amplifier is input into a second adder 57, where it is subtracted from a previously accumulated state which is the error value (Mu or µ) associated with the amplifier 56 having the highest gain. The outputs of each second adder 57 is then delayed at a delay register 60 and input into a roll-over adjustment block 62. In the embodiment of the adjustment block 62 shown in FIG. 4, each output A1, A2, A3, A4, from the delay register 60 passes into a third adder 64 and is added with a half-positive value and output as the error factor Mu (Mu-1, Mu-2, Mu-3 or Mu-4). The half positive value is generated by passing the most significant bit (MSB) from the incoming A4 value (the value from the highest gain amplifier 56) through a half-gain amplifier 66. The output of the half-gain amplifier 66 is zero when the MSB of A4 is zero, and one-half when the MSB of A4 is one. The third adders 64 add the value output from the half-gain amplifier 66 to the incoming values A1, A2, A3, and A4, when the incoming value A4 (associated with the highest gain amplifier 56) goes negative. Note that if any of the incoming values A1, A2, A3 or A4 go negative, A4 will also go negative in this downcounting NCO 32.

The outputs of the third adders 64 are labeled Mu-1, Mu-2, Mu-3 and Mu-4, and are the N timing signals 30 shown in FIG. 2 from the NCO 32 to the fractional interpolators 20, wherein for this example N=4. The MSB from the incoming value A4 associated with the highest gain amplifier 56 is also output as a strobe 58. As shown in FIG. 2, the strobe 58 is then input into both the fractional interpolators 20 and also into the error detection loop 36 as feedback. The values Mu-1 through Mu-4 will change values every clock cycle, indicating new outputs 40 from the parallel fractional interpolators 20 every clock cycle. However, the strobe 58 may or may not strobe every clock cycle, indicating that the inputs 28 to the parallel fractional interpolators 20 need not necessarily change every clock cycle. This is evident in FIG. 3, wherein the diagram shows a relation between the inputs (open circles) and the outputs (solid circles) that is non-cyclic.

Figure 5:
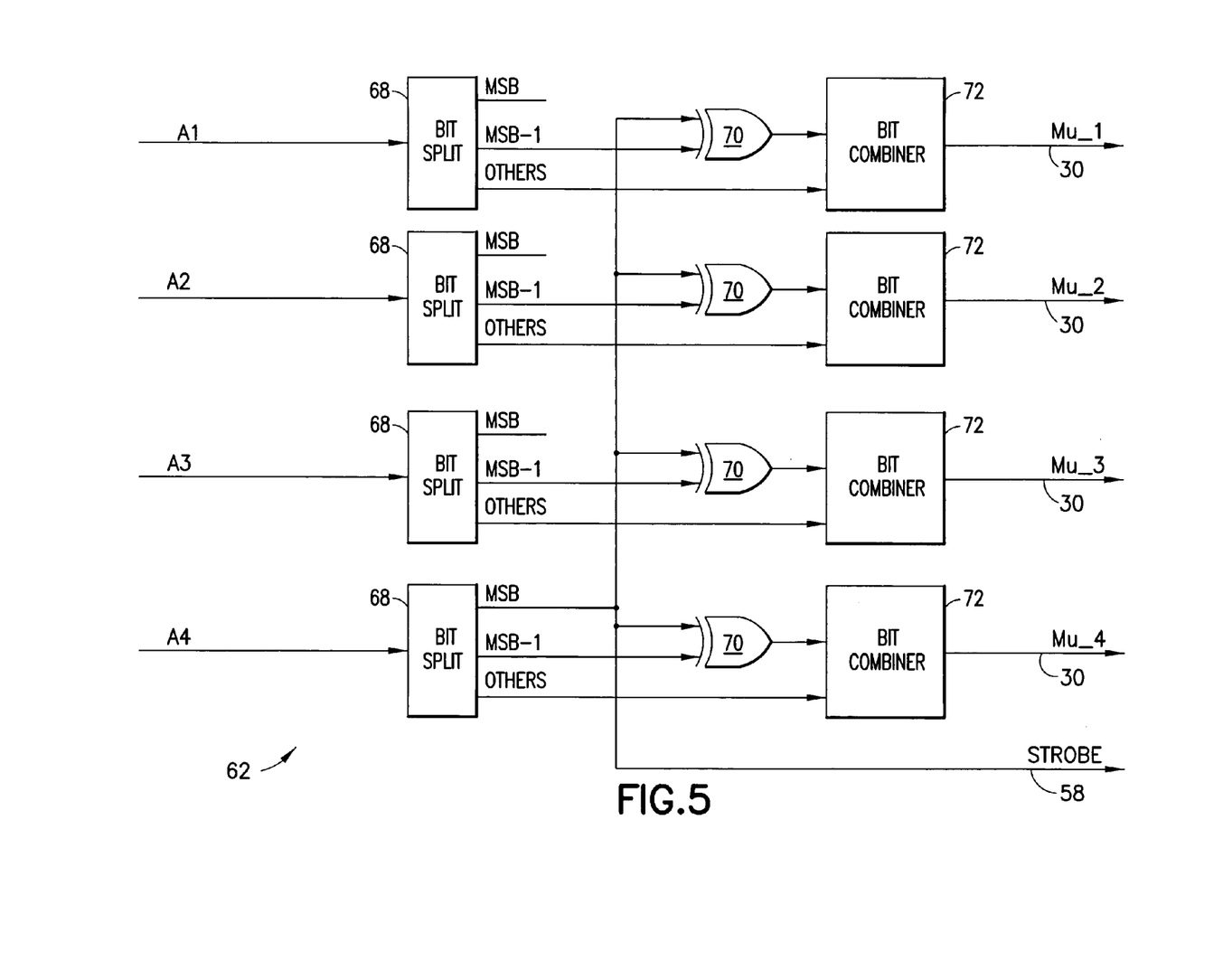
FIG. 5 is a block diagram showing an alternative embodiment of the roll-over adjustment block of FIG. 2.

FIG. 5 is a block diagram depicting an alternative arrangement to the roll-over adjustment block 62 of FIG. 4. As compared to that of FIG. 4, the roll-over adjustment block of FIG. 5 provides a simpler and therefore faster logic (less pipeline delays). Since the timing signals 30 output from the NCO 32 are always positive, they are considered unsigned. Therefore, the MSB (the sign bit) of each incoming value A1, A2, A3, A4 can be disregarded. FIG. 5 depicts an alternative embodiment wherein the input values A1, A2, A3, A4 pass into bit splitters 68. The MSB from the incoming value A4 (that is, from the highest gain amplifier 56 of FIG. 4) is input into the exclusive-or gates 70 that are each associated with one line carrying an incoming value A1, A2, A3, and A4. That same MSB from A4 is also signals a strobe output 58. Also input to each exclusive-or gate 70 is the next-most significant bit (MSB-1) for its corresponding value A1, A2, A3 or A4. The output of the exclusive-or gates 70 is then combined with all other bits (except the MSB and MSB-1) at a bit combiner 72, and output as the timing signals 30 (Mu-1, Mu-2, Mu-3, or Mu-4). The embodiment of FIG. 5 eliminates the four full additions performed by the third adders 64 and replaces them with only four exclusive-or gates 70 in a manner that performs the equivalent function faster.

Figure 6:
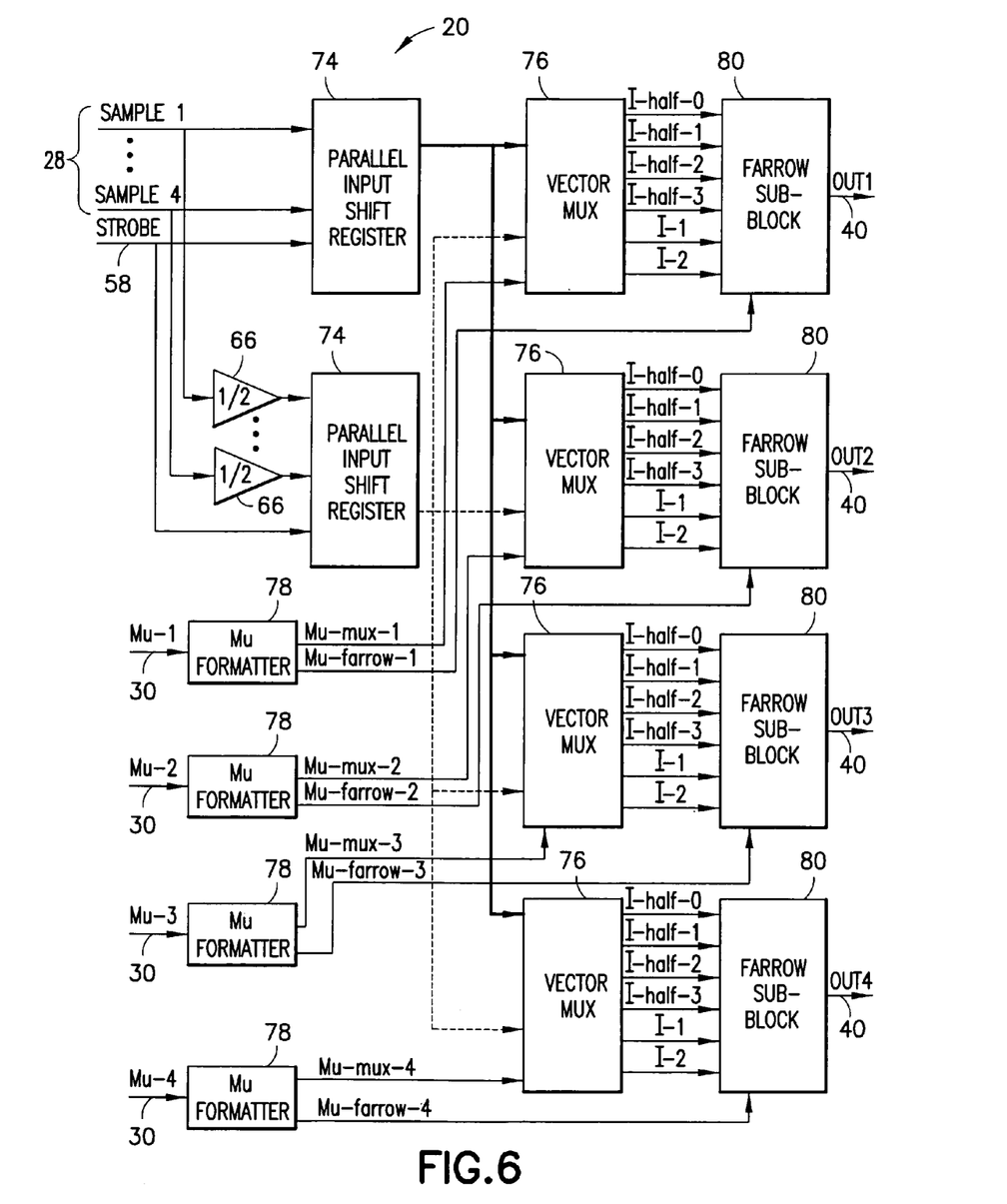
FIG. 6 is a block diagram detailing one of the parallel fractional interpolators shown in FIG. 1.

FIG. 6 is a block diagram detailing one of the parallel fractional interpolators 20 shown in FIG. 1. The inputs labeled "Sample 1" to "Sample 4" are the N complex inputs 28 from the pulse-shaping filter 26 of FIG. 1. The input labeled "Strobe" is the strobe 58 from the NCO 32, and the inputs labeled "Mu-1", "Mu-2", "Mu-3", and "Mu-4" are the timing inputs 30 from the NCO 32 previously described.

Each of the sample inputs 28 and the strobe 58 are input into one of two parallel input shift registers 74, as known in the art as a standard shift register with parallel inputs. The sample inputs 28 into one parallel input shift register 74 first pass through a half-gain amplifier 66. The outputs of each parallel input shift register 74 is input into one of four vector mux (multiplexer) block 76. The timing signals 30 from the NCO 32 are each input (labeled Mu-1, Mu-2, Mu-3, Mu-4) into a Mu formatter 78. Each of the Mu formatters 78 provides two outputs: a Mu-mux and a Mu-farrow. The Mu-mux output is input into and serves as a mux selector for the multiple muxes of a corresponding Vector mux block 76. The Mu formatter 78 is shown in more detail at FIG. 7. The Farrow sub-blocks 80 take as input the outputs of the vector mux blocks 76 and the Mu-farrows of the Mu formatters 78, and are shown in more detail at FIG. 8. The output of the Farrow sub-blocks 80 (labeled "Out 1", "Out 2", Out 3", and "Out 4") are the N complex output channels 40 of FIG. 2 that may be digitally upconverted and transmitted.

Figure 7:
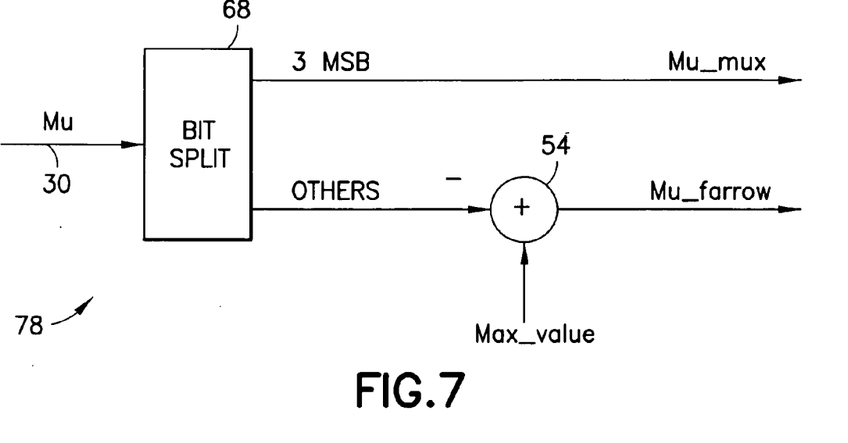
FIG. 7 is a detailed block diagram depicting one of the Mu Formatters of FIG. 4.

FIG. 7 is a detailed block diagram depicting one of the Mu formatters 78 of FIG. 6. The input Mu is the timing signal 30 from the NCO 32 of FIGS. 2 and 4-5, and represents the amount of interpolation to be done by the interpolation filter 20 on a specific input data sample block 28. The timing signal Mu 30 is input into a bit splitter 68 and split into two outputs: 3 MSB and others. The 3 MSB output represents the 3 most significant bits that is input as Mu-mux into the vector mux blocks 76 of FIG. 6 to serve as the mux selector. The 3 MSB represent a full sample shift. Three is used because $3=\log_2$(Number of parallel inputs)+1 for the example given using four parallel inputs (N=4). A different number of MSBs would be sent along the Mu-mux output line for different number of parallel inputs.

For eight parallel inputs (N=8), the bit splitter 68 would send the five MSBs as the Mu-mux output ($5=\log_2[8]+1$). The other output from the bit splitter 68 is the remaining bits (labeled others). Because the Farrow interpolator 80 requires bits in reverse order, the remaining bits are numerically reversed at an adder 54 up to a maximum value, and output as Mu-farrow to the Farrow sub-blocks 80 of FIG. 8 and described below. If a different type of interpolator structure were used other than a Farrow structure, such as an FIR filter, a linear interpolator, or a polynomial interpolator, for example, the other bits would be formatted consistent with that other structure.

Figure 8:
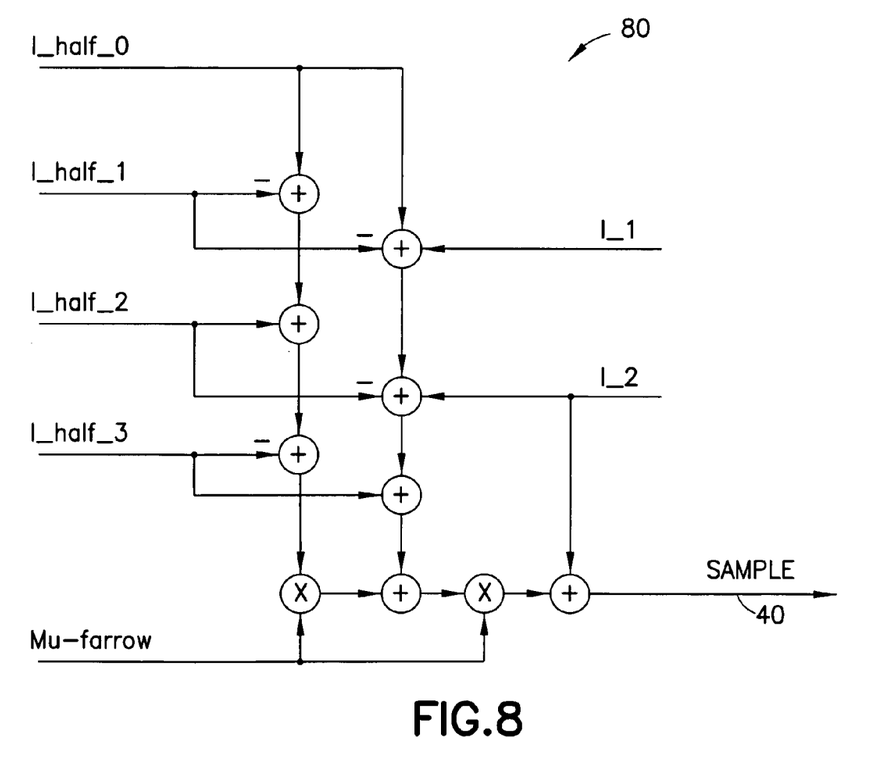
FIG. 8 is a detailed block diagram depicting one of the Farrow Sub-Blocks of FIG. 4.

FIG. 8 is a detailed block diagram depicting one of the Farrow Sub-Blocks of FIG. 6, and is known in the art. Rather than a Farrow structure, the Farrow sub-blocks 80 could be FIR sub-filter blocks with variable coefficients taken from a lookup table (RAM), indexed by the Mu value. Alternatively, the Farrow sub-blocks 80 could be linear interpolators, polynomial interpolators, etc. The Farrow sub-block 80 sums the six inputs thereto from the vector mux blocks 76 as shown, and multiplies interim sums by the Mu-farrow input from the Mu formatter 78 as shown, to arrive at a sample output 40 for each farrow sub-clock 80 that is one of the N complex output channels 40 of FIG. 2.

An interpolator circuit according to the present invention can re-sample a complex baseband signal at a rate that is not related by a rational number to the symbol rate. In other words, the sample rate $1/T_s$ is asynchronous with the strobe frequency 1/T, so the sample rate out of the interpolator 20 may differ from the sample rate into the interpolator 20 in a non-cyclic manner. The present invention is not limited to modulation type or implementation scheme. Any order modulator (linear, piece-wise parabolic, cubic, etc.) or structure (Farrow, polyphase filter bank, sinc, etc.) can use the timing scheme of the present invention. Parallel implementation allows for achieving higher sample rates using programmable devices such as digital signal processors (DSPs) and focal plane gate arrays (FPGAs).

Figure 9A:
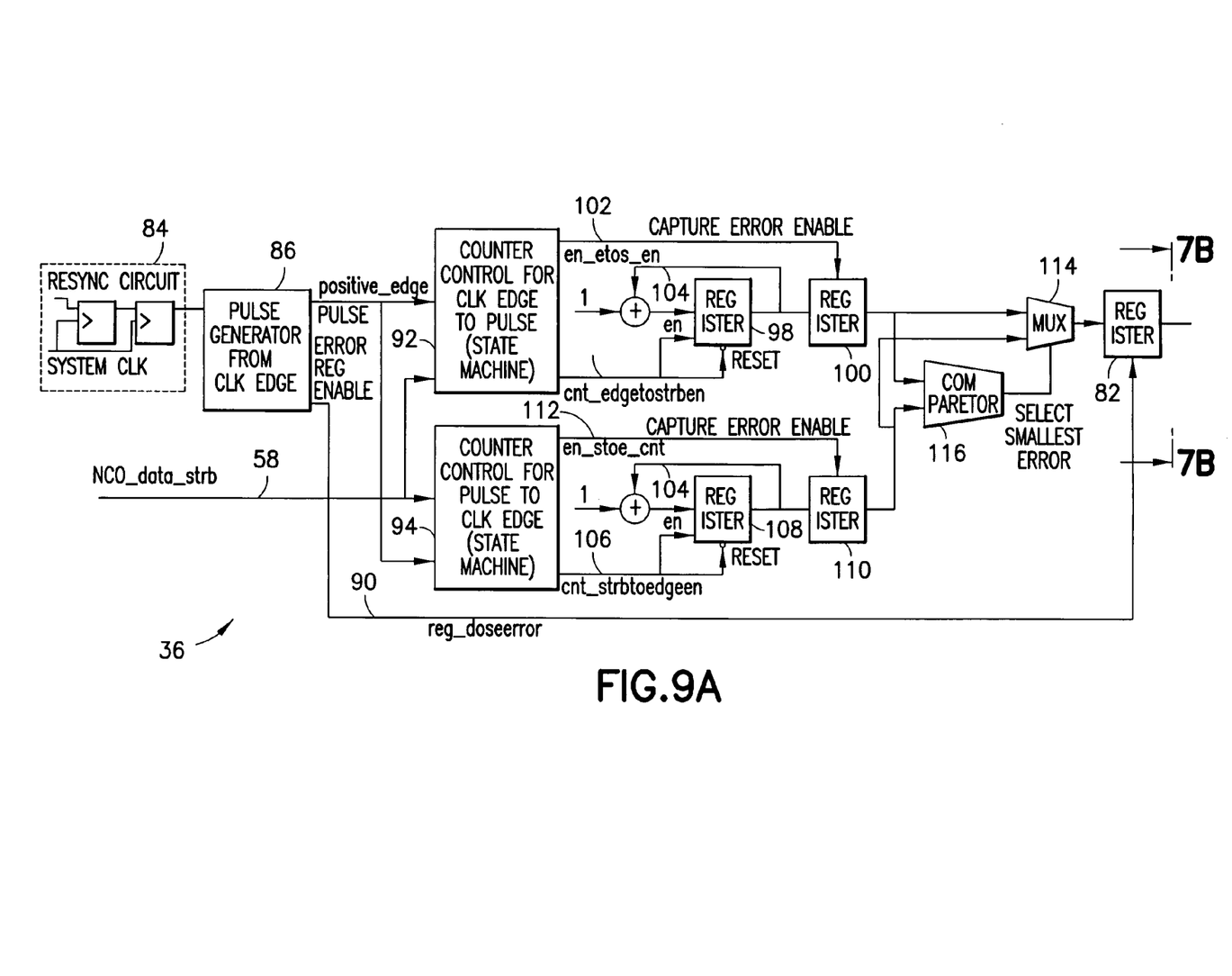
FIGS. 9A and 9B are a continuous block diagram detailing the error detection circuit of FIG. 2 that outputs a frequency to maintain phase lock.
Figure 9B:
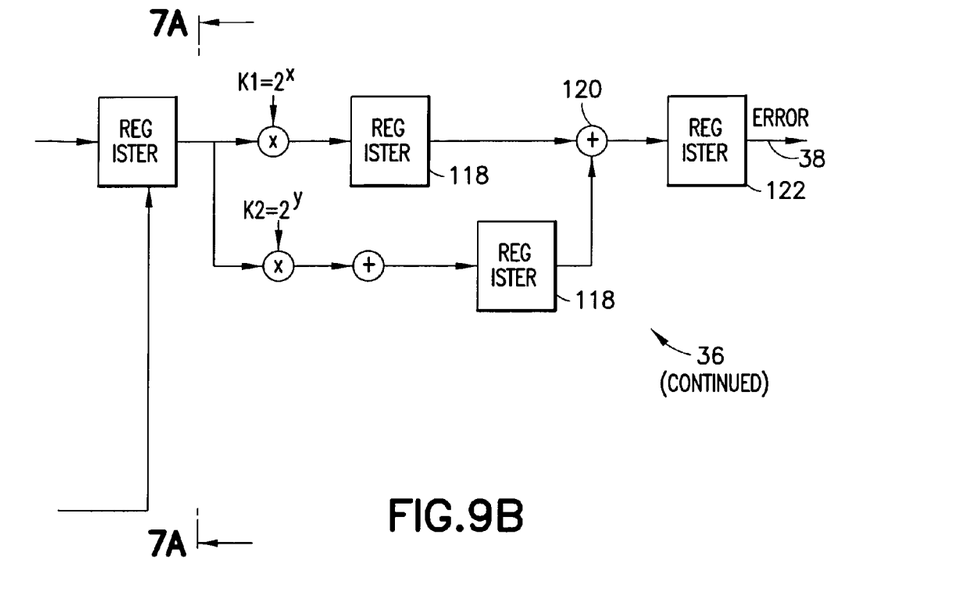
Figure 10A:
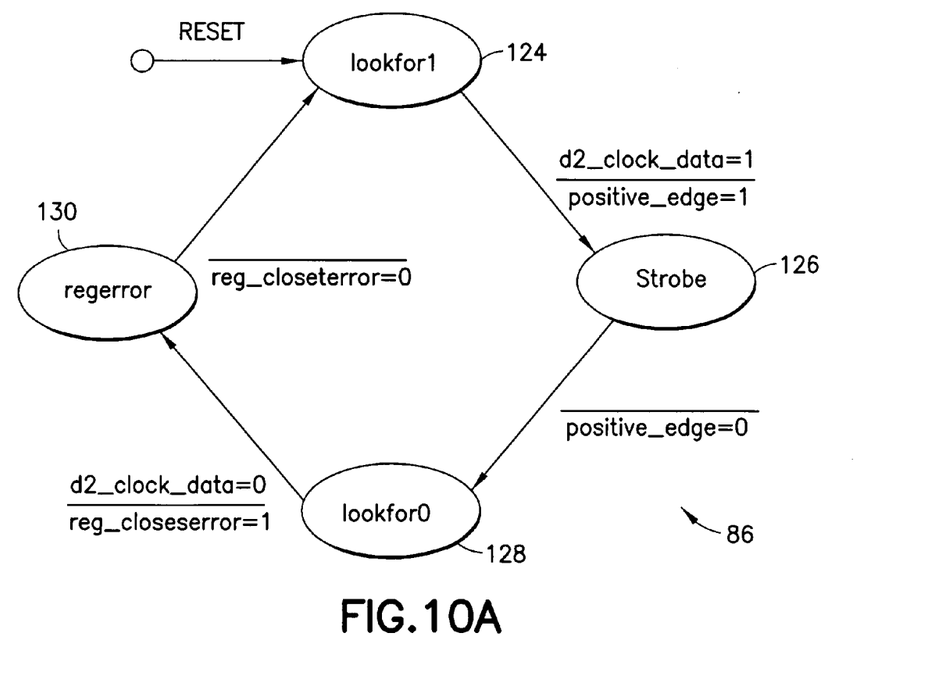
FIGS. 10A-10C are logic diagrams representing the first, second and third state machines, respectively, of FIG. 9A.
Figure 10B:
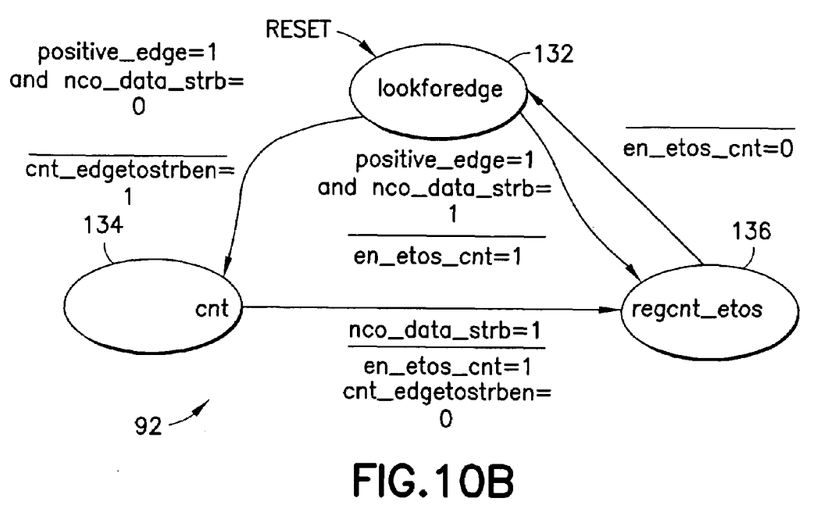
Figure 10C:
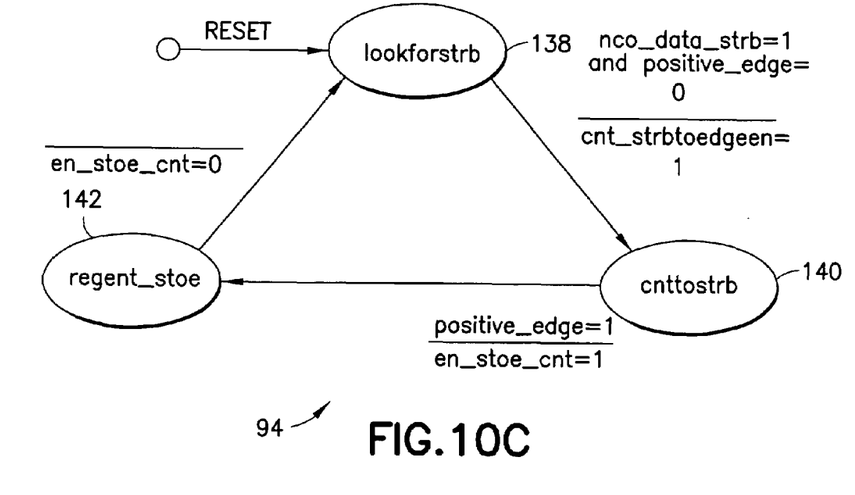

FIGS. 9A and 9B are block circuit diagrams detailing the error detection circuit 36, such as may be employed in the embodiment of FIG. 2. FIGS. 9A and 9B are extensions of each other, and a common first register 82 is depicted in shadow at FIG. 9B to orient the figures to one another. As depicted in FIG. 2, the NCO 32 generates timing signals 30 at appropriate time instances by an input from the error detection circuit 36. There are two inputs to the error detection circuit 36: a symbol rate clock signal 34 and a data strobe 58 from the NCO 32. The symbol rate clock signal 34 passes through a re-synchronization circuit 84 as known in the art. The timing signal output from the re-synchronization circuit 84 is input to a first state machine 86 that senses a clock edge of the (re-synchronized) timing signal and generates two outputs: a pulse 88 and a first error value 90. The pulse 88 from the first state machine 86 is input into both a second state machine 92 and a third 94 state machine. The first error value 90 from the first state machine 86 is input into a first register 82 where it is held until replaced. The first 86, second 92, and third 94 state machines are illustrated at FIGS. 10A-10C, respectively, as logic diagrams.

The second 92 and third 94 state machines take as inputs the pulse 88 and a data strobe 58 from the NCO 32. When there is a positive edge of the pulse 88 and no data strobe 58, the second state machine 92 counts from the positive edge until it senses a strobe 58, and outputs a forward error value 96 to a second register 98 based on that count. Preferably, the contents of the second register 98 are input into a supplementary second register 100 that is enabled by an enabling signal 102 from the second state machine 92. A feedback loop 104 may index the contents of the second register 98 on each forward error value 96 input thereto so that a plurality of forward error values 96 may be stored and weighted.

When there is a data strobe 58 but no positive edge of the pulse 88, the third state machine 94 counts from the strobe 58 until it senses a positive edge of the next subsequent pulse 88, and outputs a reverse error value 106 to a third register 108. Preferably, the contents of the third register 108 are input into a supplementary third register 110 that is enabled by an enabling signal 112 from the third state machine 94.

An incrementing feedback loop 104 indexes the contents of the third register 108 on each reverse error value 106 input thereto so that a plurality of reverse error values 106 may be stored and weighted.

The outputs of each of the second supplemental register 100 and the third supplemental register 110 are each input into a multiplexer 114 and a comparator 116. The comparator 116 outputs the smaller of the (absolute) forward and reverse error values 92, 106, that are input thereto, and the multiplexer 114 combines the output of the supplemental registers 100, 110, along with the output of the comparator 116, to result in a basic error value that is stored in the first register 82.

The first register 82 is illustrated again at FIG. 9B but there is only one first register 82 in the combined illustration. The basic error value from the first register 82 is input into a second order loop filter so that the characteristics of how the data strobe 58 follows the sample clock 38 can be adjusted by software changes only. Preferably, the basic error value is divided into parallel pathways and each pathway is multiplied by one of two gain coefficients K1 or K2. Each of K1 and K2 are preferably power of two multipliers. For example, if $K1=2^x$ and $K2=2^y$, the variables x and y may be imputed from a digital signal processor (DSP) so that software changes to the microprocessor enable slow or quick tracking of the NCO data strobe 58 to the (re-synchronized) sample clock signal 38. Registers 118 each store an amplified error output from one or the other of the two pathways, their contents are added at an adder 120, and stored in a final register 122 to be output to the NCO 32 as a frequency adjustment 38. Preferably, the final register 122 scales back the frequency adjustment 38 to eight bits. The various registers throughout the circuit 36 enable it to operate at higher speeds.

In general, the above approach moves the positive edge of the pulse 88 generated from the symbol rate clock 34 to match the data strobe 58 of the NCO 32. An alternative embodiment encompasses counting the length of the period of the symbol rate clock 34, and adjusting the period of the NCO data strobe 58 to match that period. A second alternative embodiment incorporates a clock in the NCO 32 tuned to the data strobe 58. The signal from the NCO clock would be added to the signal from the symbol rate clock 34 and integrated over a period. The result is the phase adjustment 38, and circuitry similar to that described above for the error detection circuit 36 would drive the phase adjustment 38 to zero. When that happens, the NCO clock and the sample clock 34 are synchronized but 180° out of phase, which is rectified by an inverter.

The first state machine 86 is described logically at FIG. 10A, wherein at a reset condition 124 the first state machine 86 looks for the positive edge of a clock signal, such as the symbol clock. Once the positive edge is detected at block 124, the first state machine 86 generates a pulse at block 126 that is output to each of the second 92 and third 94 state machines. The first state machine 86 then immediately looks for a null or zero clock signal at block 128, and registers the error at block 130. In FIG. 9A, the error was registered at the first register 82.

As illustrated in FIG. 10B, the reset condition of the second state machine 92 at block 132 is to look for the edge of the pulse input from the first state machine 86. Once that edge is detected, which is synchronous with the positive edge of the symbol clock due to the first state machine 86, the second state machine 92 counts at block 134 until the data strobe 58 from the NCO which is input directly to the second state machine from the NCO. When the second state machine 92 finds the data strobe, it registers the count from pulse edge to strobe at block 136, preferably at the second register 98 of FIG. 9A.

FIG. 10C illustrates the third state machine 94, wherein the reset condition at block 138 sets the third state machine 94 searching for the data strobe 58 that is input from the NCO 32. Once the third state machine senses the data strobe 58, it counts at block 140 until it senses the edge of the pulse generated by the first state machine 86, and registers that count at block 142, preferably in the third register 108 as described with reference to FIG. 9A. After registering the count or error as the case may be, the first 86, second 92 and third 94 state machines each return to their respective reset conditions 124, 132, and 138, respectively.

The input data samples are taken once every sample time $T_0$, so that each sample is identified by $mT_s$ wherein m is a signal index. A filter index i is then:

$$i = \mathrm{int}\left[\frac{kT_i}{T_s}\right] - m$$

wherein int[z] means the largest integer not exceeding z and $T_i$ is the sampling instant. A basepoint index $m_k$ is defined as:

$$m_k = \mathrm{int}\left[\frac{kT_i}{T_s}\right];$$

and a fractional interval μ is:

$$\mu_k = \frac{kT_i}{T_s} - m_k,$$

where $0 \leq \mu_k < 1$. The ratio $T_i/T_s$ is irrational, as when the sampling rate is not synchronous with the symbol rate, $\mu_k$ is irrational and changes for each interpolant. If $T_i$ were commensurate with $T_s$ but not equal, μk is cyclical.

In the embodiment of FIGS. 9A-9B using three state machines 86, 92 and 94, the value $\mu T_s$ is the forward error value 96 from the first state machine 92, and the value $(1-\mu)T_s$ is the reverse error value 106 from the third state machine 94. The output of the fractional interpolator 20 is controlled by the strobe 58, which occurs at each $kT_i$.

Considering again FIG. 2, assume that each of the depicted pulse shaping filters 26 are polyphase filters sampling four times per symbol, so that one in-phase sample block 22 and one quadrature sample block 24 result in four complex (I and Q) output data sample blocks 28 from each of the pulse shaping filters 26. Those output data sample blocks 28 are also the inputs to the fractional interpolators 20. If the clock speed is 100 MHz, the effective data rate is increased to 400 MHz by means of the polyphase pulse shaping filters 26 operating in parallel in addition to the modulation and up-conversion block 42. Thus a single I data block input 22 and a single Q data block input 24 are converted to eight separate complex data sample blocks 28. Each of the two depicted pulse shaping filter 26 samples an input data block channel 22, 24 at one of four times per symbol to yield eight output data sample blocks 28 (four from each filter).

While described in the context of presently preferred embodiments, those skilled in the art should appreciate that various modifications of and alterations to the foregoing embodiments can be made, and that all such modifications and alterations remain within the scope of this invention. Examples herein are stipulated as illustrative and not exhaustive.

What is claimed is:

1. A circuit for re-sampling N data inputs comprising:
    a timing error detector sub-circuit having a first input coupled to a symbol rate clock and a second input coupled to a strobe;
    an oscillator having an input coupled to an output of the timing error-detector sub-circuit and N timing signal outputs for outputting N timing signals in parallel and a second output for outputting the strobe; and
    at least one fractional interpolator having parallel inputs coupled to N data inputs in parallel and to the N timing signals in parallel, for outputting N data outputs in parallel, wherein N is an integer greater than one,
    wherein the error detector sub-circuit operates to synchronize the strobe to a positive edge of the input that is coupled to the symbol rate clock and comprises:
        a first state machine for generating and outputting a pulse based on the symbol rate clock;
        a second and a third state machine in electrical parallel with one another, each having an input coupled to the strobe and to an output of the first state machine; and
        wherein the oscillator input is coupled to an output of at least one of the second or third state machines.

2. The circuit of claim 1 wherein the oscillator comprises a plurality of N amplifiers each defining a different gain, and wherein the strobe comprises a most significant bit selected from an output of one of the amplifiers.

3. The circuit of claim 2 wherein each of the N timing signals are coupled to an output of an associated amplifier, and each timing signal except that coupled to a highest gain amplifier is independent of a most significant bit output from said associated amplifier.

4. The circuit of claim 1 wherein the fractional interpolator comprises:
    a shift register having parallel inputs coupled to the N data inputs and to the strobe; and
    N bit splitters each having an input coupled to a timing signal, for each outputting a first error value that depends at least in part from a most significant bit (MSB) defined by the timing signal and for outputting a second error value that depends at least in part from at least one other bit defined by the timing signal that is not the MSB.

5. The circuit of claim 4 wherein the fractional interpolator further comprises:
    N sub-blocks each having an input coupled to an output of the shift register and an input coupled to an output of an error-formatter.

6. The circuit of claim 5 wherein the sub-blocks are of the type Farrow sub-blocks, linear interpolators, or polynomial interpolators.

7. The circuit of claim 1 wherein the error detector sub-circuit further comprises a loop filter defining a gain determined by a microprocessor, wherein the oscillator input is coupled to an output of the loop filter.

8. The circuit of claim 1 wherein the error detector sub-circuit synchronizes the strobe by adjusting a period between two consecutive strobes to match a period defined by the symbol rate clock.

9. The circuit of claim 1 wherein the error detector sub-circuit further comprises an oscillator data clock having an input coupled to the strobe, and an integrator having a first input coupled to an output of the oscillator data clock and a second input coupled to an output of the symbol rate clock, the integrator having an output coupled to an inverter, and wherein the oscillator input is coupled to an output of the inverter.

10. The circuit of claim 1 wherein the N data outputs are output at a rate at least equal to a symbol rate determined by the symbol rate clock.

* * * * *